(12) United States Patent
Nishimura

(10) Patent No.: US 8,310,422 B2
(45) Date of Patent: Nov. 13, 2012

(54) OPERATIONAL AMPLIFIER CIRCUIT AND DISPLAY APPARATUS USING THE SAME

(75) Inventor: Kouichi Nishimura, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 932 days.

(21) Appl. No.: 12/320,935

(22) Filed: Feb. 9, 2009

(65) Prior Publication Data

US 2009/0201237 A1   Aug. 13, 2009

(30) Foreign Application Priority Data

Feb. 12, 2008 (JP) .................................. 2008-031149

(51) Int. Cl.
G09G 3/36 (2006.01)
(52) U.S. Cl. ......................................................... 345/87
(58) Field of Classification Search .................. None
See application file for complete search history.

(56) References Cited

U.S. PATENT DOCUMENTS

| | | | |
|---|---|---|---|
| 6,424,219 B1 | 7/2002 | Kato | |
| 7,495,512 B2 * | 2/2009 | Tsuchi | 330/260 |
| 7,545,305 B2 * | 6/2009 | Tsuchi | 341/144 |
| 2002/0067207 A1 * | 6/2002 | Kato | 330/255 |
| 2002/0067208 A1 * | 6/2002 | Ugajin et al. | 330/258 |
| 2003/0146792 A1 * | 8/2003 | Ausserlechner | 330/297 |
| 2006/0255856 A1 | 11/2006 | Nishimura | |
| 2007/0159248 A1 * | 7/2007 | Tsuchi | 330/253 |
| 2008/0316196 A1 * | 12/2008 | Ito et al. | 345/212 |
| 2009/0201237 A1 * | 8/2009 | Nishimura | 345/87 |
| 2009/0303210 A1 * | 12/2009 | Nishimura | 345/204 |
| 2010/0265273 A1 * | 10/2010 | Nishimura | 345/690 |

FOREIGN PATENT DOCUMENTS

| | | |
|---|---|---|
| JP | 10-31200 | 2/1998 |
| JP | 10-31200 (A) | 2/1998 |
| JP | 2002-175052 A | 6/2002 |
| JP | 2002-175052 (A) | 6/2002 |
| JP | 2006-319921 A | 11/2006 |
| JP | 2007-181026 A | 7/2007 |
| JP | 2007-181026 (A) | 7/2007 |

OTHER PUBLICATIONS

"Analysis and Design of Analog Integrated Circuits" P.R. Gray & R.G. Mayer, John Wiley & Sons, 1977.
Japanese Office Action dated Jul. 6, 2011, with partial English translation.
Notification of Reason for Refusal dated Apr. 18, 2012 (with a partial English translation).
Chinese Office Action dated May 23, 2012 with a partial English translation thereof.

* cited by examiner

Primary Examiner — Peter Vincent Agustin
(74) Attorney, Agent, or Firm — McGinn IP Law Group, PLLC

(57) ABSTRACT

An operational amplifier circuit includes: an input differential stage circuit supplied with power supply voltages in a first voltage range; and an output stage circuit supplied with power supply voltages in a second voltage range which is different from the first voltage range. The operational amplifier circuit amplifies a signal supplied to the input differential stage circuit and outputs the amplified signal from the output stage circuit to drive a load.

14 Claims, 11 Drawing Sheets

US 8,310,422 B2

OPERATIONAL AMPLIFIER CIRCUIT AND DISPLAY APPARATUS USING THE SAME

INCORPORATION BY REFERENCE

This patent application claims priority on convention based on Japanese Patent Application No. 2008-031149. The disclosure thereof is incorporated herein by reference.

BACKGROUND OF THE INVENTION

1. Field of the Invention

The present invention relates to an operational amplifier circuit and a display apparatus including a display panel driven by the operational amplifier circuit.

2. Description of Related Art

A recent tendency of a flat display panel is toward increase in size. In a TV field, in particular, even a liquid crystal panel exceeding 100 inches has appeared. It is considered that the tendency will be unchanged in the future. On the other hand, as the liquid crystal panel is increased in size, load on a data line in a TFT_LCD (Thin Film Transistor Liquid Crystal Display) increases, and therefore a power consumption amount of an amplifier in an LCD driver for driving the TFT_LCD tends to increase.

In order to reduce the number of LCD drivers to be used, the number of outputs of one chip is increased. For this reason, a power consumption amount of one chip increases, and therefore power consumption of the whole of LCD apparatus increases. The increase in power consumption amount causes a problem of an abnormal increase in chip temperature.

As a measure to such increase in chip temperature, tape to be mounted with the chip is devised to keep a thermal resistance low, or a heat radiating tape is attached to the chip. However, any of them causes cost-up. For this reason, a technique for reducing the power consumption amount in the LCD driver has been required. A large number of amplifiers (operational amplifiers) are used in the LCD driver, and therefore it is important to reduce the power consumption amount of the amplifier, to significantly reduce the power consumption amount of the whole LCD driver.

FIG. 1 is a diagram illustrating a configuration of an operational amplifier circuit as a related art intended to reduce the power consumption amount. The operational amplifier circuit for driving capacitive load (pixel capacitors) on one data line by two operational amplifiers will be described.

Referring to FIG. 1, the operational amplifier circuit includes a positive polarity operational amplifier 10 (Posi_AMP) and a negative polarity operational amplifier 20 (Nega_AMP). An input node 120 of the operational amplifier 10 is supplied with the input signal INP, and an input node 220 of the operational amplifier 20 is supplied with an input signal INN. It should be noted that the input signals INP and INN are analog data signals converted by D/A converters. The D/A converter outputting the input signal INP is driven in a power supply voltage range from VDD/2 to VDD. For this reason, the input signal INP takes a voltage value within a positive polarity voltage range (VDD/2 to VDD). Similarly, the D/A converter outputting the input signal INN is driven within a power supply voltage range of VSS (GND) to VDD/2. For this reason, the input signal INN takes a voltage value within a negative polarity voltage range (VSS (GND) to VDD/2).

The operational amplifier 10 is connected to form a voltage follower, and outputs a positive polarity output signal OUTP (in the positive polarity power supply voltage from VDD/2 to VDD) to an output node 110. A positive polarity power supply node 101 of the operational amplifier 10 is connected to a power supply line VDD and a negative polarity power supply node 102 of the operational amplifier 10 is connected to a power supply line VDD/2 (of the power supply voltage VDD/2). That is, the operational amplifier 10 is applied with voltages in the power supply voltage range from VDD/2 to VDD. The operational amplifier 20 is connected to form a voltage follower, and outputs a negative polarity output signal OUTN (in the negative polarity power supply voltage from VSS (GND) to VDD/2) to an output node 210. A positive polarity power supply node 201 of the operational amplifier 20 is connected to the power supply line VDD/2 (of the power supply voltage VDD/2) and a negative polarity power supply node 202 of the operational amplifier 20 is connected to the power supply line VSS (of the ground voltage GND). That is, the operational amplifier 20 is applied with voltages in the power supply voltage from VSS (GND to VDD/2. The output nodes 110 and 210 are connected to capacitive load (pixel capacitor) through a data line.

FIG. 2 is a circuit diagram illustrating an example of an internal equivalent circuit of the operational amplifier 10. The operational amplifier 10 includes N-channel MOS (NMOS) transistors MN10 and MN20, P-channel MOS (PMOS) transistors MP10, MP20, and MP30, constant current sources I10 and I20, a resistor R10, and a capacitor C10. The NMOS transistors MN10 and MN20 constitute a differential pair in which gates of the transistors MN10 and MN20 are respectively connected to the output node 110 and the input node 120. The PMOS transistors MP10 and MP20 have a function of active load, and configure a Widlar type current mirror. The constant current source I10 supplies a bias current to the differential pair transistors (NMOS transistors MN10 and MN20). The differential pair and the active load form a differential amplifier. A differential signal of the input signal INP and the output signal OUTP is single-converted by the differential amplifier, and then outputted to a gate of the PMOS transistor MP30.

The PMOS transistor MP30 determines a voltage at the output node 110 in accordance with the output from the differential amplifier. At this time, the constant current source I20 functions as active load for the PMOS transistor MP30. Also, the resistor R10 and the capacitor C10 are connected in series between the gate of the PMOS transistor MP30 and the output node 110 to function as a phase compensation circuit.

FIG. 3 is a circuit diagram illustrating an example of an internal equivalent circuit of the operational amplifier 20. The operational amplifier 20 includes NMOS transistors MN30, MN40, and MN50, PMOS transistors MP40 and MP50, constant current sources I30 and I40, a resistor R20, and a capacitor C20. The PMOS transistors MP40 and MP50 configure a differential pair in which gates of the transistors MP40 and MP50 are respectively connected to an output node 210 and an input node 220. The NMOS transistors MN30 and MN40 have a function of active load, and configure a Widlar type current mirror. The constant current source I30 supplies a bias current to the differential pair transistors (PMOS transistors MP40 and MP50). The differential pair and the active load form a differential amplifier. A differential signal of the input signal INN and an output signal OUTN is single-converted by the differential amplifier, and then outputted to a gate of the NMOS transistor MN50.

The NMOS transistor MN50 determines a voltage at the output node 210 in accordance with an output from the differential amplifier. At this time, the constant current source I40 functions as active load for the NMOS transistor MN50. Also, the resistor R20 and the capacitor C20 are connected in series between the gate of the NMOS transistor MN50 and the output node 210 to function as a phase compensation circuit.

The input node 120 of the operational amplifier 10 is supplied with the input signal INP within the positive polarity voltage range (VDD/2 to VDD). For this reason, if the negative polarity power supply node 102 of the operational amplifier 10 is supplied with the power supply voltage VDD/2, the operational amplifier 10 is operable. Similarly, the input node 220 of the operational amplifier 20 is supplied with the input signal INN within the positive polarity voltage range (VSS to VDD/2). For this reason, if the positive polarity power supply node 201 of the operational amplifier 20 is supplied with the power supply voltage VDD/2, the operational amplifier 10 is operable. Accordingly, as illustrated in FIGS. 2 and 3, a part or whole of a current flowing through the negative polarity power supply node 102 in the operational amplifier 10 flows into the positive polarity power supply node 201 of the operational amplifier 20. As a result, the current used in the operational amplifier 10 can be reused in the operational amplifier 20, and therefore a power consumption amount can be reduced.

Also, a detailed operation such as phase compensation in the circuits shown in FIGS. 2 and 3 is described in other literature "Analysis and Design of Analog Integrated Circuits" by Paul R. Gray and Robert G. Meyer (John Wiley & Sons, Inc.), and therefore the detailed description is omitted here.

Further, a technique of a liquid crystal driver using positive and negative polarity operational amplifiers is described in Japanese Patent Application Publication (JP-A-Heisei 10-31200).

By connecting the power supplies for the operational amplifiers as illustrated in FIG. 1, the power consumption amount (in particular, static power consumption) is made approximately half. However, the power supply voltages supplied to the operational amplifiers 10 and 20 are not original voltages (VSS and VDD), and therefore the voltages of the input signals INP and INN are limited. In the operational amplifier 10, since a differential pair is formed from the NMOS transistors MN10 and MN20, a voltage range supplyable to the operational amplifier 10 is from (VDD/2+VGS (MN1)+VDS(sat)) to VDD when VDD/2 is supplied to the negative polarity power supply node 102. Here, VGS(MN1) is a gate-source voltage of the NMOS transistor MN10, and VDS(sat) is a drain-source voltage at a boundary between triode and pentode regions of a MOS transistor constituting the constant current source I10.

Similarly, in the operational amplifier 20, since a differential pair formed from the PMOS transistors MP40 and MP50, a voltage range supplyable to the operational amplifier 20 is from VSS to (VDD/2−VGS(MPL)−VDS(sat)) when VDD/2 is supplied to the positive polarity power supply node 201. Here, VGS(MP1) is a gate-source voltage of the PMOS transistor MP40, and VDS(sat) is a drain-source voltage at a boundary between triode and pentode regions of a MOS transistor constituting the constant current source I30.

For these reasons, a positive polarity voltage of the input signal INP supplied to the operational amplifier 10 is limited to a range of (VDD/2+VGS(MN1)+VDS(sat)) to VDD, and the negative polarity voltage of the input signal INN supplied to the operational amplifier 20 is limited to a range of VSS to (VDD/2−VGS(MP1)−VDS(sat)). Specifically, the voltage of the input signal INP is limited to a range of (VDD/2+1 V) to VDD, and that of the input signal INN is limited to a range of VSS to (VDD/2−1 V). Characteristics required as a typical LCD driver include a range of VDD/2 to (VDD−0.2 V) as the voltage of the input signal INP, and (VSS+0.2 V) to VDD/2 as the voltage of the input signal INN. Therefore, the operational amplifier circuit illustrated in FIG. 1 does not meet the input voltage range (input characteristics) required for an amplifier used in the LCD driver.

When the operational amplifier employs a Rail-to-Rail configuration (not shown), the above-described problem can be solved. In this case, however, there arises a problem that the term of the output deviation specific to the LCD driver is not met. The reason why the problem arises is in that the output deviation is deteriorated based on a change in an operational state of a differential stage near a power supply voltage.

SUMMARY

In an aspect of the present invention, an operational amplifier circuit includes: an input differential stage circuit supplied with power supply voltages in a first voltage range; and an output stage circuit supplied with power supply voltages in a second voltage range which is different from the first voltage range. The operational amplifier circuit amplifies a signal supplied to the input differential stage circuit and outputs the amplified signal from the output stage circuit to drive a load.

In another aspect of the present invention, a display apparatus includes: a digital-analog converter configured to output one of reference voltages outputted from a gray scale voltage generating circuit to the operational amplifier circuit based on a display signal; a display panel having a pixel; and an operational amplifier circuit configured to drive the pixel based on the output from the digital-analog converter. The operational amplifier circuit includes: an input differential stage circuit supplied with power supply voltages in a first voltage range and configured to amplify a signal outputted from the digital-analog converter; and an output stage circuit supplied with power supply voltages in a second voltage range which is different from the first voltage range, and configured to output the amplified signal to drive the pixel as a load.

According to the present invention, the power consumption can be reduced while maintaining the characteristics for driving a display panel.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Figure 1:
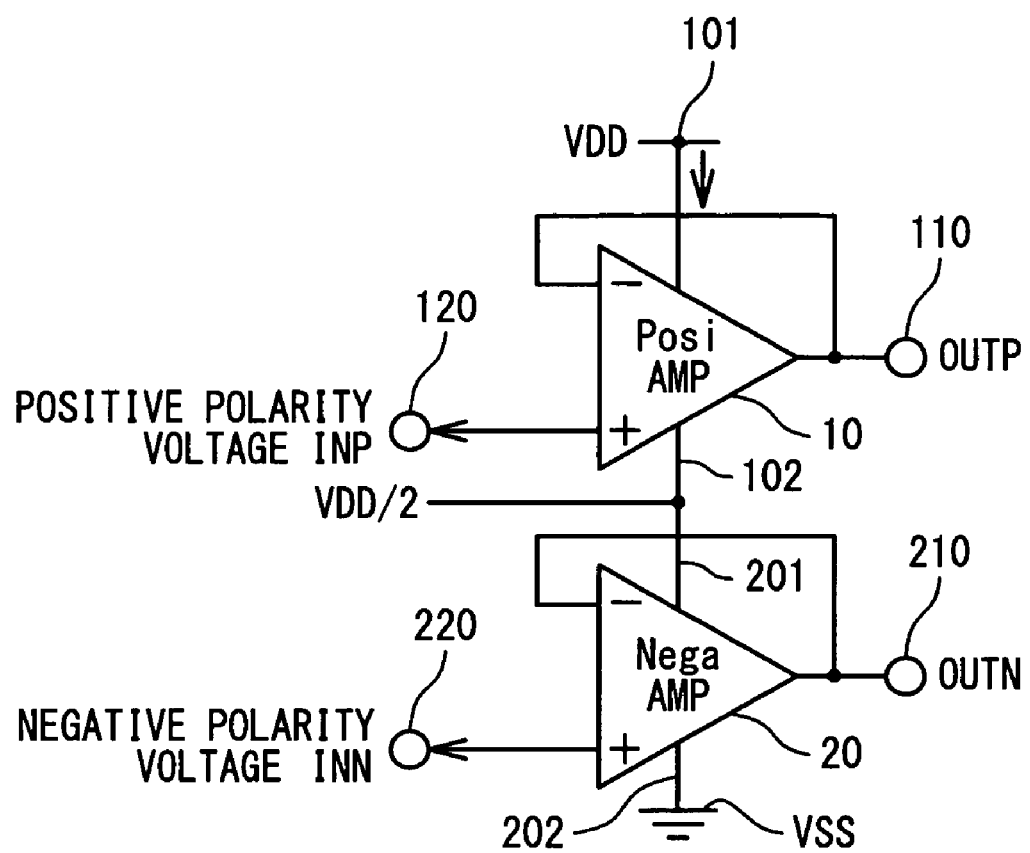
FIG. 1 is a circuit diagram showing a power supply configuration of an operational amplifier circuit in a related art.
Figure 2:
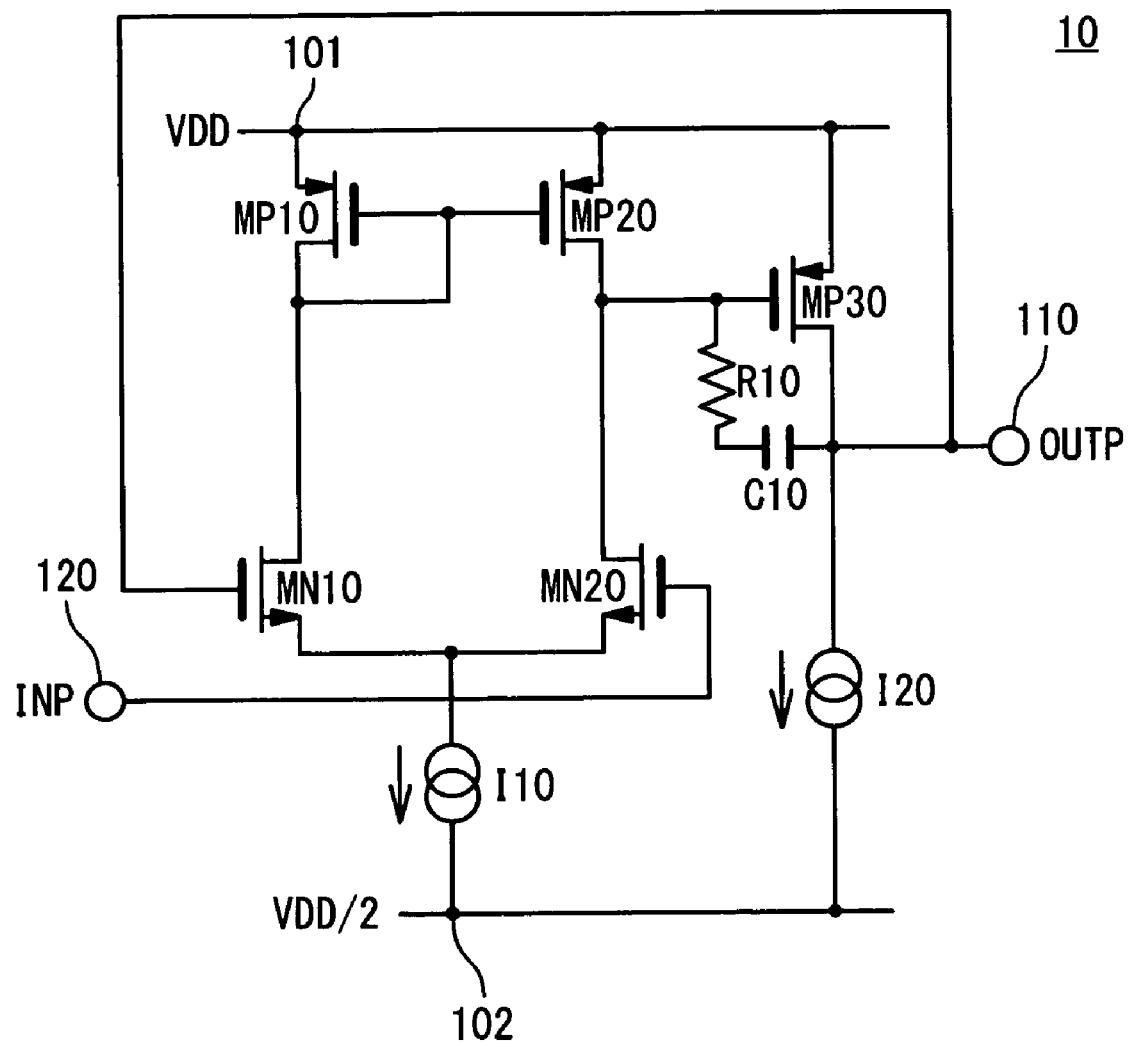
FIG. 2 is a circuit diagram showing a configuration of a positive polarity operational amplifier in FIG. 1.
Figure 3:
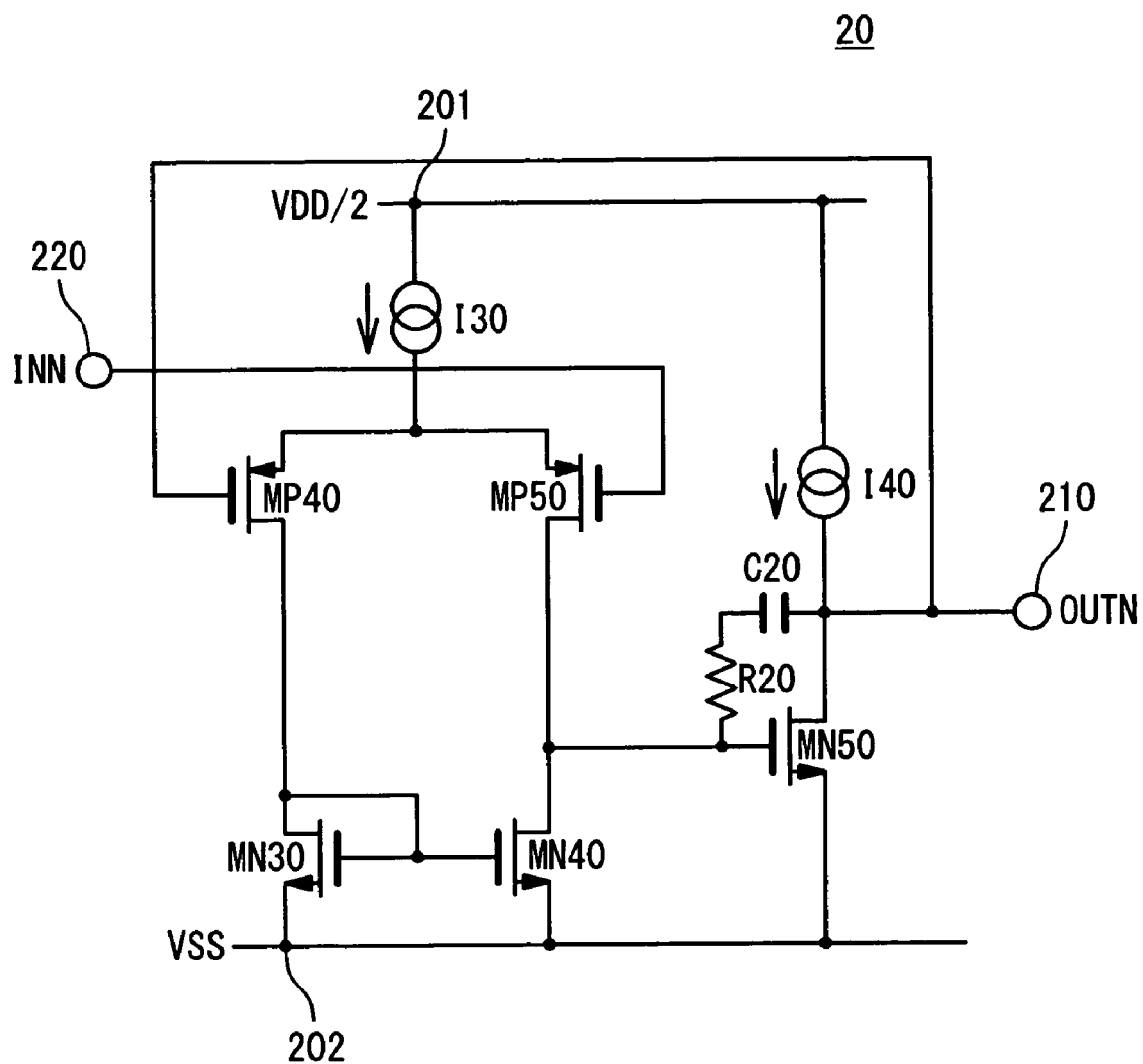
FIG. 3 is a circuit diagram showing a configuration of a negative polarity operational amplifier in FIG. 1.

Hereinafter, a display apparatus using an operational amplifier circuit of the present invention will be described with reference to the attached drawings. In the drawings, the same or similar reference numerals or symbols refer to the same or similar components.

1. First Embodiment

Figure 4:
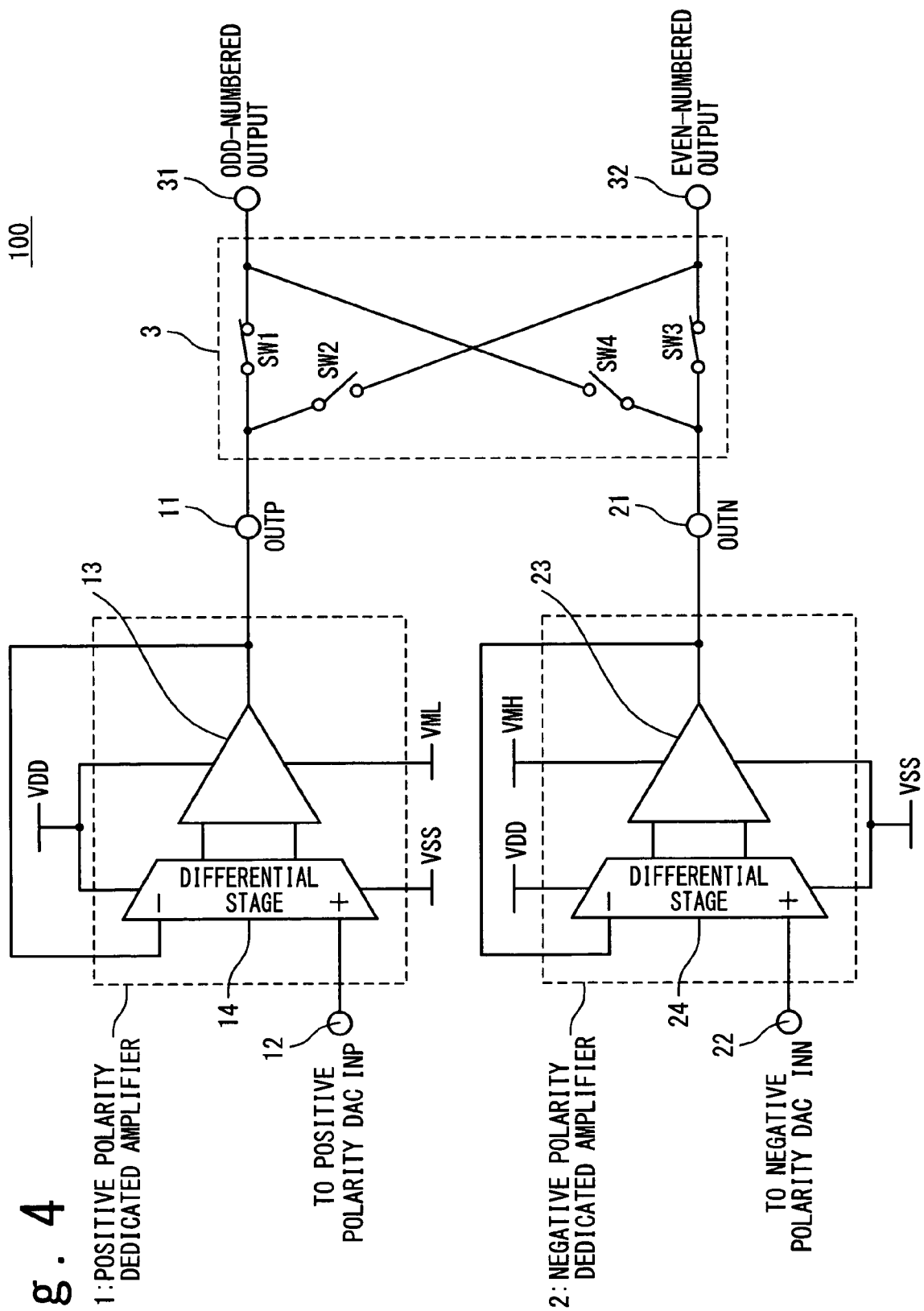
FIG. 4 is a circuit diagram showing a configuration of an operational amplifier circuit according to a first embodiment of the present invention.

FIG. 4 is a block diagram showing a configuration of a power supply of an operational amplifier circuit 100 according to a first embodiment of the present invention. Referring to FIG. 4, the operational amplifier circuit 100 according to the present invention is preferably used for an LCD driver for driving capacitive load in an LCD panel with amplifying a positive polarity voltage input signal INP and a negative polarity voltage input signal INN outputted from a D/A (digital/analog) converter (DAC).

The operational amplifier circuit 100 includes an operational amplifier 1 (hereinafter to be referred to as a positive polarity dedicated amplifier 1) for amplifying the input signal INP to output a positive polarity voltage signal (an output signal OUTP), an operational amplifier 2 (hereinafter to be referred to as a negative polarity dedicated amplifier 2) for amplifying the input signal INN to output a negative polarity voltage signal (an output signal OUTN), and a cross switch 3 for switching between polarities of voltages outputted to drain lines (output nodes 31 and 32) in an LCD panel. The output nodes 31 and 32 are respectively connected to the capacitive load (pixel capacitors) in the display panel through the drain lines. The capacitive load is activated by the output signals OUTP and OUTN from the operational amplifiers 1 and 2.

The operational amplifiers 1 and 2 include input differential stages 14 and 24, and output stages 13 and 23 for amplifying outputs of the input differential stages 14 and 24, respectively. Hereinafter, the input differential stages 14 and 24 are referred to as differential stages 14 and 24, the output stage 13 as a positive polarity dedicated output stage 13, and the output stage 23 as a negative polarity dedicated output stage 23.

The positive polarity dedicated amplifier 1 is connected to constitute a voltage follower, and amplifies the input signal INP supplied to a non-inversion input node 12 to output to an output node 11 as the output signal OUTP. In the positive polarity dedicated amplifier 1, the differential stage 14 operates in a power supply voltage range between a negative polarity power supply voltage VSS (ground voltage GND) and a positive polarity power supply voltage VDD, and the positive polarity signal dedicated output stage 13 operates in a power supply voltage range between a power supply voltage VML and the positive polarity power supply voltage VDD.

The negative polarity dedicated amplifier 2 is connected to constitute a voltage follower, and amplifies the input signal INN supplied to a non-inversion input node 22 to output to an output node 21 as the output signal OUTN. In the negative polarity dedicated amplifier 1, the differential stage 24 operates in a power supply range between the negative polarity power supply voltage VSS (e.g., ground voltage GND) and the positive polarity power supply voltage VDD, and the negative polarity dedicated output stage 23 operates in a power supply voltage range between the negative polarity power supply voltage VSS and a power supply voltage VMH.

The power supply voltage VML is a voltage higher than the negative polarity power supply voltage VSS, and the power supply voltage VMH is a voltage lower than the positive polarity power supply voltage VDD. Also, the power supply voltage VML is preferably set to (VDD−VSS)/2 or less. If the negative polarity power supply voltage VSS is set to the ground voltage GND, the power supply voltage VML preferably takes a voltage equal to or less than a half of the positive polarity power supply voltage VDD, i.e., (VDD/2) or less. Further, the power supply voltage VMH is preferably set to (VDD−VSS)/2 or more. If the negative polarity power supply voltage VSS is set to the ground voltage GND, the power supply voltage VMH preferably takes a voltage equal to or more than a half of the positive polarity power supply voltage VDD, i.e., (VDD/2) or more.

The cross switch 3 is provided between the output nodes 11 and 21 of the positive and negative polarity dedicated amplifiers 1 and 2 and the drain lines (output nodes 31 and 32) of the LCD panel. The cross switch 3 includes a switch SW1 for controlling a connection between the nodes 11 and 31, a switch SW2 for controlling a connection between the nodes 11 and 32; a switch SW3 for controlling a connection between the nodes 21 and 32, and a switch 4 for controlling a connection between the nodes 21 and 31. The switches SW1 and SW3 are alternately controlled to switch between a connection state between the output nodes 11 and 31 and a connection state between the output nodes 21 and 32, and the switches SW2 and SW4 are alternately controlled to switch a connection state between the output nodes 11 and 32 and a connection state between the output nodes 21 and 31. Thus, the polarities of the voltages outputted to the drain lines (the output nodes 31 and 32) are switched, to prevent image persistence of the LCD panel.

Figure 5:
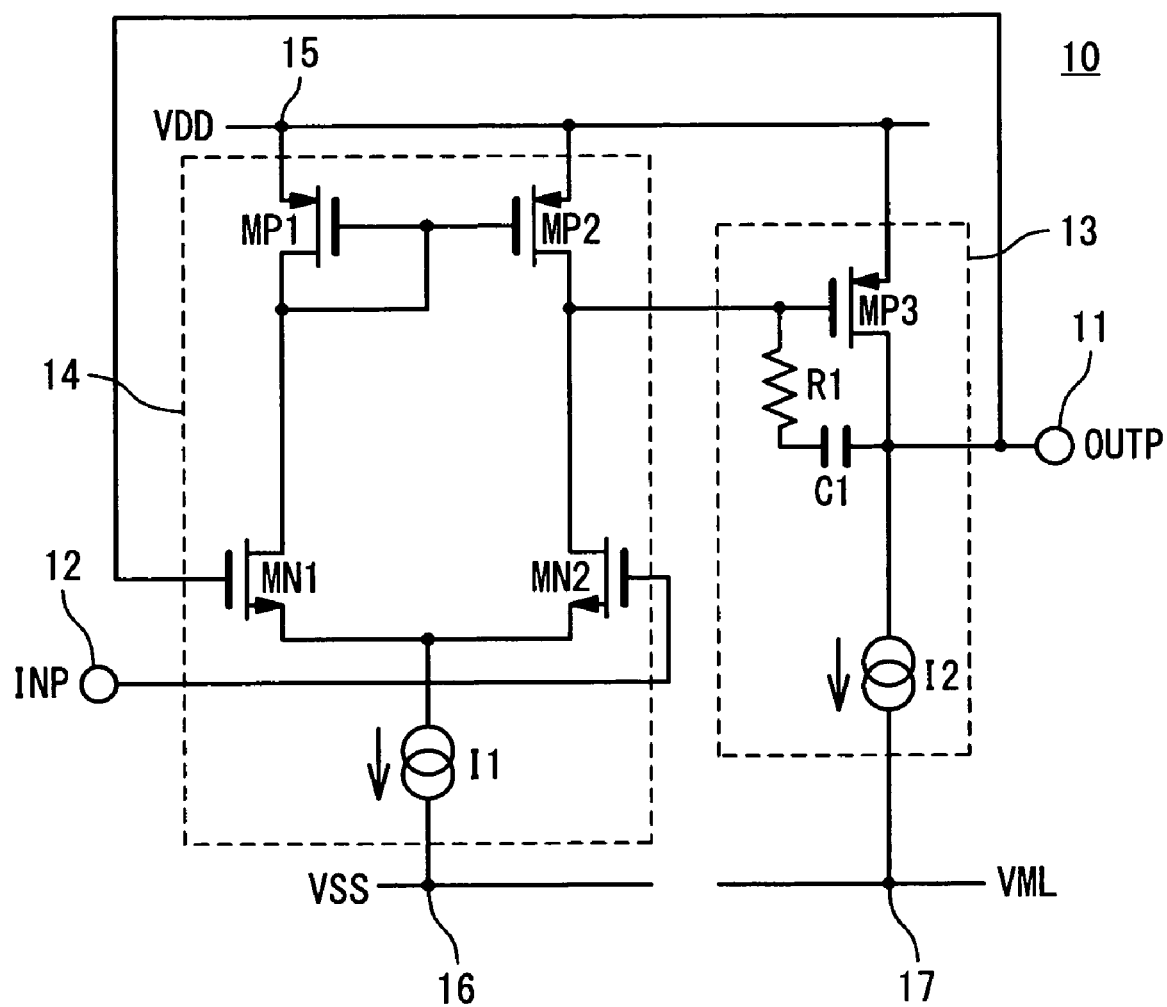
FIG. 5 is a circuit diagram showing a configuration of a positive polarity amplifier of the operational amplifier according to the first embodiment of the present invention.

FIG. 5 is a circuit diagram illustrating an internal equivalent circuit of the positive polarity dedicated amplifier 1 in the first embodiment. Referring to FIG. 5, a detailed configuration of the positive polarity dedicated amplifier 1 according to the present invention will be described.

The differential stage 14 of the positive polarity dedicated amplifier 1 includes N-channel MOS (NMOS) transistors MN1 and MN2, P-channel MOS (PMOS) transistors MP1 and MP2, and a constant current source I1. The NMOS transistors MN1 and MN2 are respectively connected to the output node 11 and the input node 12 at their gates to form a differential pair. Sources of the NMOS transistors MN1 and MN2 are connected in common through the constant current source I1 to a power supply node 16 supplied with the negative polarity power supply voltage VSS. The PMOS transistors MP1 and MP2 have a function of active load, and form a Widlar type current mirror. Specifically, sources of the PMOS transistors MP1 and MP2 are connected in common to a power supply node 15 supplied with the positive polarity power supply voltage VDD. Gates of the PMOS transistors MP1 and MP2 are connected in common to drains of the PMOS transistor MP1 and NMOS transistor MN1. Further, drains of the PMOS transistor MP2 and the NMOS transistor MN2 are connected in common to the output stage 13 (gate of a PMOS transistor MP3) to provide a single-end output of the differential stage 14. The constant current source I1 is connected between the sources of the NMOS transistors MN1 and MN2 and the power supply node 16 for the negative polarity power supply voltage VSS to supply a bias current to the differential pair transistors.

The positive polarity dedicated output stage 13 includes the PMOS transistor MP3, a resistor R1, a capacitor C1, and a constant current source I2. The PMOS transistor MP3 is connected to the power supply node 15 at a source thereof and to a power supply node 17 supplied with the power supply voltage VML at a drain thereof through a constant current source I2. Also, a drain of the PMOS transistor MP3 is connected to the output node 11. Thus, the PMOS transistor MP3 determines a voltage at the output node 11 according to a single-end output supplied to the gate from the differential stage 14. The constant current source I2 functions as active load for the PMOS transistor MP3. The resistor R1 and the capacitor C1 are connected in series between the gate and the drain (output node 11) of the PMOS transistor MP3 to function as a circuit for phase compensation.

A gate of the NMOS transistor MN1, which is an inversion input node of the positive polarity dedicated amplifier 1, and the output node 11 are connected, and a gate of the NMOS transistor MN2 is connected with the non-inversion input node 12. For this reason, the positive polarity dedicated amplifier 1 operates as the voltage follower.

Figure 6:
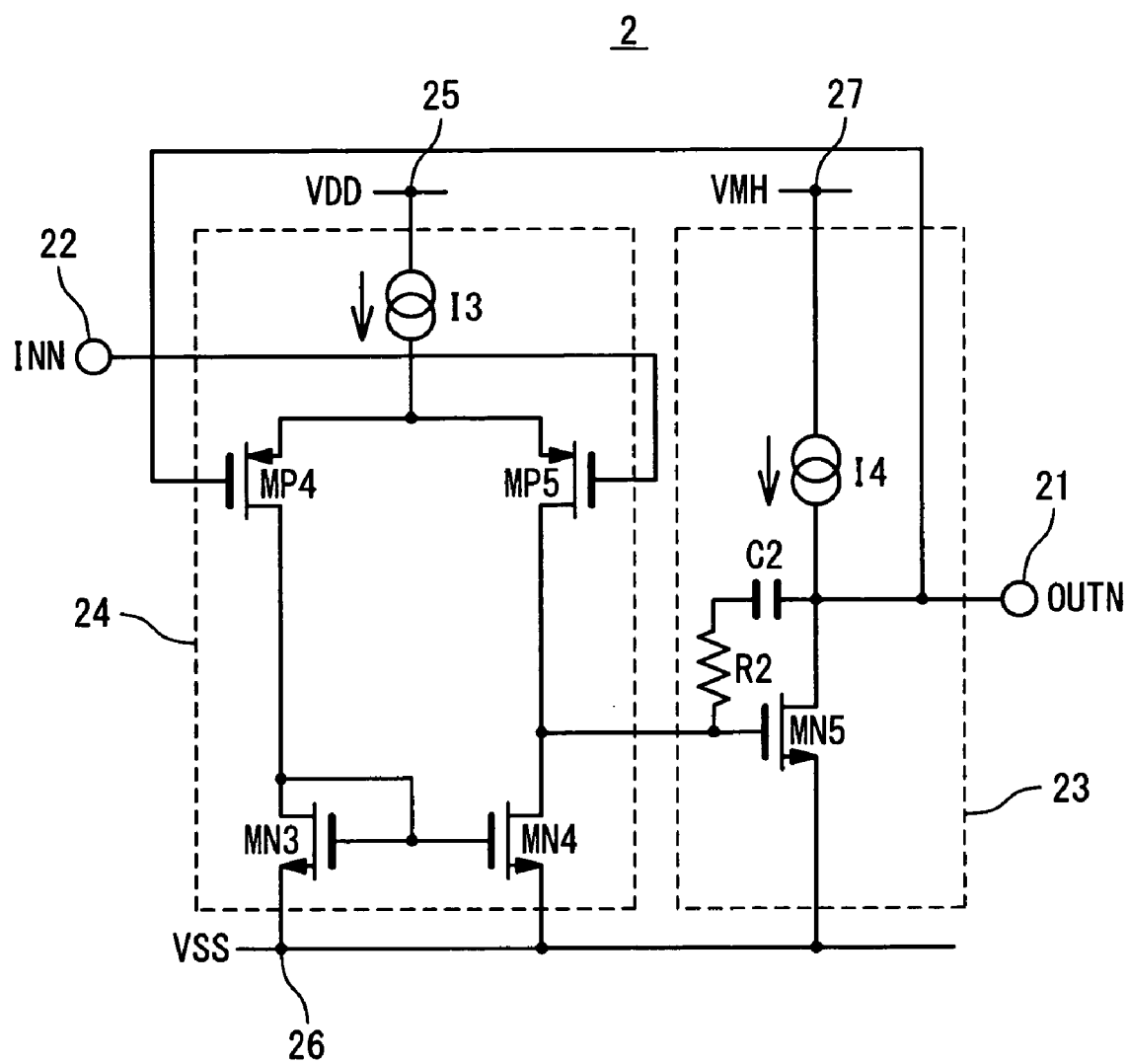
FIG. 6 is a circuit diagram showing a configuration of a negative polarity amplifier of the operational amplifier according to the first embodiment of the present invention.

FIG. 6 is a circuit diagram illustrating an internal equivalent circuit of the negative polarity dedicated amplifier 2 in the first embodiment. Referring to FIG. 6, a detailed configuration of the negative polarity dedicated amplifier 2 according to the present invention will be described.

The differential stage 24 of the negative polarity dedicated amplifier 2 includes NMOS transistors MN3 and MN4, PMOS transistors MP4 and MP5, and a constant current source I3. The PMOS transistors MP4 and MP5 are respectively connected to the output node 21 and the input node 22 at gates thereof to form a differential pair. Sources of the PMOS transistors MP4 and MP5 are connected in common to a power supply node 25 supplied with the positive polarity power supply voltage VDD through the constant current source I3. The NMOS transistors MN3 and MN4 have a function of active load, and form a Widlar type current mirror. Specifically, sources of the NMOS transistors MN3 and MN4 are connected in common to a power supply node 26 supplied with the negative polarity power supply voltage VSS. Gates of the NMOS transistors MN3 and MN4 are connected in common to drains of the NMOS transistor MN3 and the PMOS transistor MP3. Further, drains of the NMOS transistor MN4 and the PMOS transistor MP5 are connected in common to the negative polarity dedicated output stage 23 (gate of an NMOS transistor MN5) to provide a single-end output of the differential stage 24. The constant current source I3 is connected between the sources of the PMOS transistors MP4 and MP5 and the power supply node 25 supplied with the positive polarity power supply voltage VDD to supply a bias current to the differential pair transistors (the PMOS transistors MP4 and MP5).

The negative polarity dedicated output stage 23 includes the NMOS transistor MN5, a resistor R2, a capacitor C2, and a constant current source I4. The NMOS transistor MN5 is connected to the power supply node 26 at a source thereof and to a power supply node 27 for the power supply voltage VMH (fourth voltage) at a drain thereof through the constant current source I4. Also, the drain of the NMOS transistor MN5 is connected to the output node 21. Thus, the NMOS transistor MN5 determines a voltage at the output node 21 according to the single-end output supplied from the differential stage 24 to the gate. The constant current source I4 functions as active load for the NMOS transistor MN5. The resistor R2 and the capacitor C2 are connected in series between the gate and the drain of the NMOS transistor MN5 to function as a circuit for phase compensation.

The gate of the PMOS transistor MP4, which is an inversion input node of the negative polarity dedicated amplifier 2, and a drain of the output node 21 are connected, and the gate of the PMOS transistor MP5 is connected to the non-inversion input node 22. For this reason, the negative polarity dedicated amplifier 2 operates as the voltage follower.

By the configuration as described above, the input differential stages 14 and 24 in the positive and negative polarity dedicated amplifiers 1 and 2 operate in the power supply voltage range from the negative polarity power supply voltage VSS to the positive polarity power supply voltage VDD. On the other hand, the positive polarity dedicated output stage 13 of the positive polarity dedicated amplifier 1 operates in the power supply voltage range from the power supply voltage VML higher than the negative polarity power supply voltage VSS to the positive polarity power supply voltage VDD, and the negative polarity dedicated output stage 23 of the negative polarity dedicated amplifier 2 operates in the power supply voltage range from the power supply voltage VSS to the power supply voltage VMH lower than the positive polarity power supply voltage VDD.

(Operation)

Next, referring to FIGS. 4 to 6, an operation of the operational amplifier circuit 100 according to the present invention is described.

A voltage range of the input signal INP supplied from a DAC is typically from VDD/2 to VDD. On the other hand, the differential stage 14 operates in the power supply voltage range between the negative polarity power supply voltage VSS (GND) and the positive polarity power supply voltage VDD. For this reason, a voltage range supplyable to the positive polarity dedicated amplifier 1 is (VSS+VGS(MN1)+VDS(sat)) to VDD. Here, VGS(MN1) is a gate-source voltage of the NMOS transistor MN1, and VDS(sat) is a drain-source voltage at a boundary between a triode region and a pentode region of a MOS transistor constituting the constant current source I1. Accordingly, a supplyable voltage range of the positive polarity dedicated amplifier 1 meets input characteristics required in a LCD panel.

Also, a voltage range of the input signal INN supplied from the DAC is typically from VSS to VDD/2. On the other hand, the differential stage 24 operates in the power supply voltage range between the negative polarity power supply voltage VSS (GND) and the positive polarity power supply voltage VDD. For this reason, a voltage range supplyable to the negative polarity dedicated amplifier 2 is from (VSS+VGS(MP4)+VDS(sat)) to VDD. Here, VGS(MP4) is a gate-source voltage of the PMOS transistor MP4, and VDS(sat) is a drain-source voltage at a boundary between the triode region and the pentode region of a MOS transistor constituting the constant current source I3. Accordingly, the supplyable voltage range of the negative polarity dedicated amplifier 2 meets the input characteristics required in the LCD panel.

On the other hand, ranges of power supply voltages supplied to the positive polarity dedicated stage 13 and negative polarity dedicated output stage 23 are limited as compared with the input differential stages 14 and 24, and therefore outputtable voltage ranges of them are limited.

The positive polarity dedicated amplifier 1 is connected to constitute the voltage follower, and therefore a voltage (Vout) of the output signal OUTP and a voltage (Vin) of the input signal INP become equal to each other. That is, Vout=Vin. It should be noted that this relationship is established when a supplyable voltage range and an outputtable voltage range of the positive polarity dedicated amplifier 1 meet input/output characteristics required in an LCD driver.

The outputtable voltage range of the positive polarity dedicated amplifier 1 is (VML+0.2 V) to (VDD−0.2 V). Typically, output characteristics required as a positive polarity dedicated amplifier used for the LCD driver include (VDD/2+0.2 V) to (VDD−0.2 V). Accordingly, to meet the output characteristics required as the LCD driver, the power supply voltage VML is preferably higher than the negative polarity power supply voltage VSS and not higher than a half of the positive polarity power supply voltage VDD, i.e., VSS<VML≦VDD/2. In this case, an operation voltage range of the positive polarity dedicated amplifier 1 is sufficient for the positive polarity input/output amplifier, and meets the characteristics required in the LCD driver.

Similarly, the outputtable voltage range of the negative polarity dedicated amplifier 2 is (VSS+0.2 V) to (VMH−0.2 V). Typically, the output characteristics required for the negative polarity dedicated amplifier used for the LCD driver include (VSS+0.2 V) to (VDD/2−0.2 V). Accordingly, to meet the output characteristics required for the LCD driver, the power supply voltage VMH is preferably not lower than a half of the positive polarity power supply voltage VDD and lower than the positive polarity power supply voltage VDD, i.e., VDD/2≦VMH<VDD. In this case, an operation voltage range of the negative polarity dedicated amplifier 2 is sufficient for the positive input/output amplifier, and meets the characteristics required in the LCD driver.

Also, even if the ranges of the power supply voltages supplied to the differential stages 14 and 24 are wide, currents flowing through the differential stages 14 and 24 are generally small. In the present invention, to maintain input characteristics of the amplifiers, the power supply voltages (VSS to VDD) in the wide voltage ranges are supplied to the differential stages 14 and 24. However, currents flowing through the differential stages 14 and 24 are small, and therefore power consumption amounts at the differential stages 14 and 24 are very small as compared with those at the output stages 13 and 23. That is, the power consumption amounts at the differential stage 14 and 24 have little influence on power consumption amount in the whole operational amplifier circuit 100.

On the other hand, currents flowing through the output stages 13 and 23 are summations of idling currents which are several times more than those flowing through the input differential stages 14 and 24, and a currents flowing through output stages, and therefore typically is approximately 80% or more of a consumption current in a whole of the operational amplifiers 1 and 2. Accordingly, reduction in the consumption currents by reducing power supply voltages only for the output stages 13 and 23 (reducing the power supply voltage ranges) has a large effect on the reduction in consumption power of the whole of the operational amplifiers 1 and 2.

Figure 7:
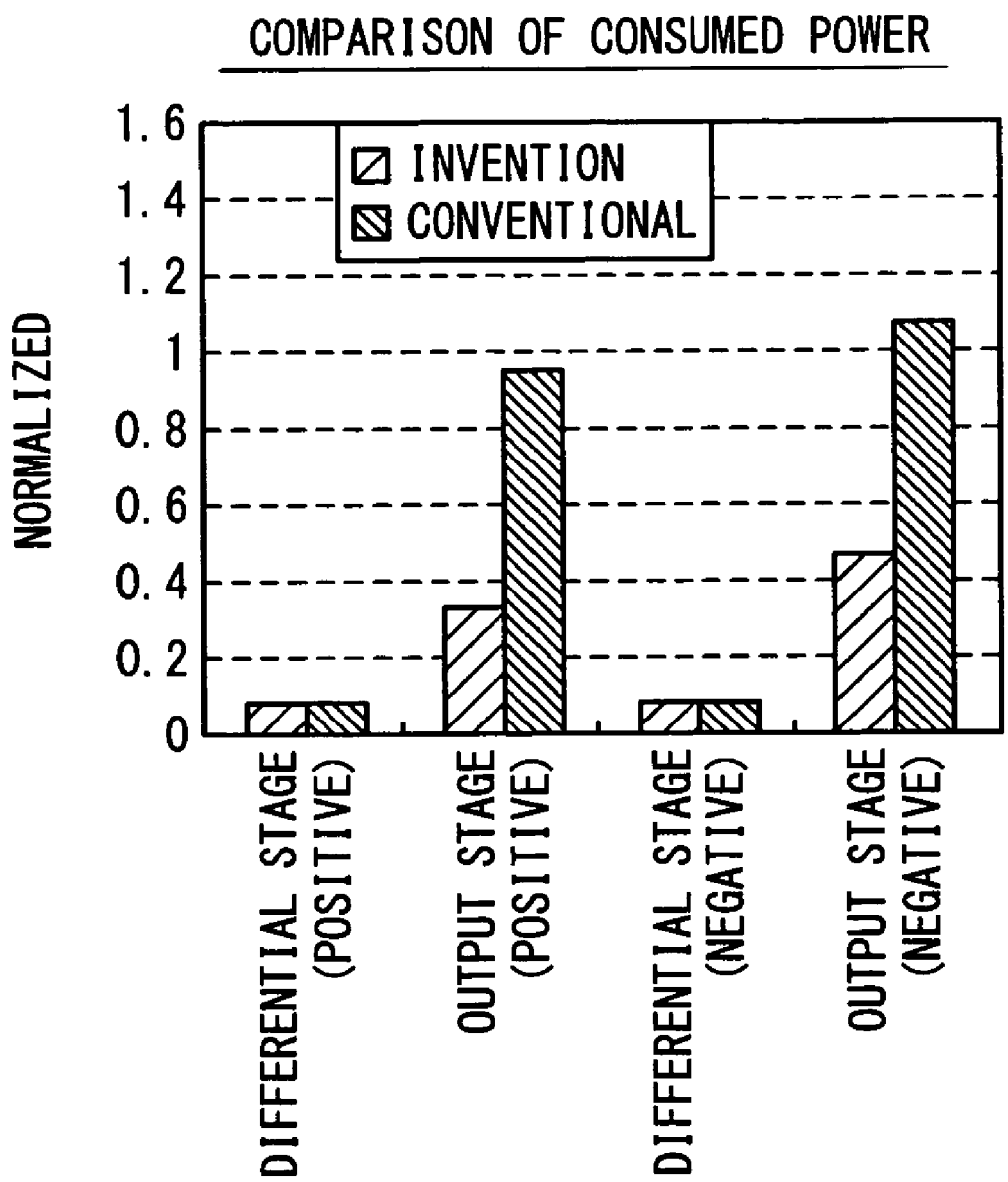
FIG. 7 is a diagram showing a comparison example between power consumption amounts in a related art and the present invention.

FIG. 7 is a diagram illustrating an example of a simulation result in which a power consumption amount when the output nodes 31 and 32 of the operational amplifier circuit 100 according to the present invention are connected with capacitive load (pixel capacitors) and a power consumption amount according to a conventional technique are compared with each other. The graphs illustrated in FIG. 7 represent a comparison in the power consumption amount in a column inversion driving method between the conventional technique and the present invention. Referring to FIG. 7, a horizontal axis represents items into which an operational amplifier and corresponding switch section are separated, and a vertical axis represents normalized power consumption amount. As described above, in the present invention, the operation voltages (output voltage ranges) of the output stages 13 and 23 are limited to be small. For this reason, as illustrated in FIG. 7, the power consumption amounts of the output stages 13 and 23 in the operational amplifiers 1 and 2 are dramatically reduced as compared with those in the conventional technique.

Figure 9:
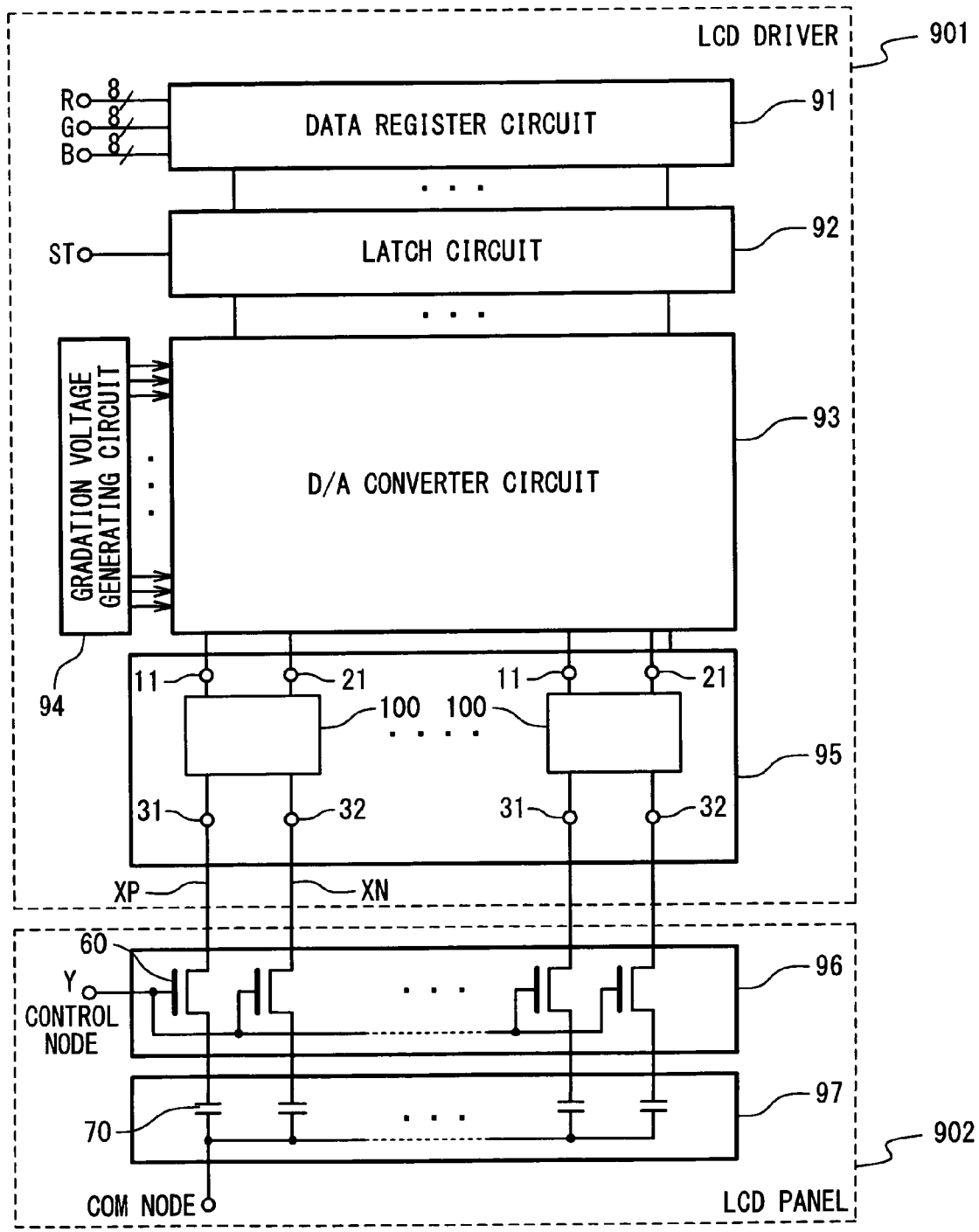
FIG. 9 is a diagram showing a configuration of a display apparatus using the operational amplifier circuit according to the present invention.

The operational amplifier circuit 100 of the present invention is preferably used for a data line driving circuit 95 of an LCD driver 901 provided in a display device 90 illustrated in FIG. 9. Referring to FIG. 9, the display apparatus 90 includes a driver (LCD driver 901), and a display panel (LCD panel 902) driven by the LCD driver 901.

The LCD driver 901 includes a data register circuit 91 for holding 8-bit digital display signals R, G, and B, a latch circuit 92 for latching the digital signals R, G, and B in synchronization with a strobe signal ST, a D/A converter circuit 93 including parallel N-stage digital/analog converters (positive polarity DAC and negative polarity DAC), a liquid crystal gray scale voltage generating circuit 94 for outputting gray scale voltages having gamma conversion characteristics depending on liquid crystal characteristics, and a data line driving circuit 95 having a plurality of operational amplifier circuits 100 for buffering voltages from the D/A converter circuit 93.

The LCD panel 902 includes TFTs (Thin Film Transistors) 60 (TFT group 96) provided in positions where pluralities of positive polarity data lines XP and negative polarity data lines XN and a plurality of scan lines Y intersect with each other, and a plurality of pixel capacitors 70 (pixel capacitor group 97). A gate of the TFT 60 is connected to an unshown gate driver through a scan line Y. Also, a source of the TFT 60 is connected to the operational amplifier circuit 100 through the positive polarity data line XP or the negative polarity data line XN, and a drain of the TFT 60 is connected to a COM node through the pixel capacitor 70.

In FIG. 9, the LCD panel 902 is illustrated only one row of TFT group 96 and pixel capacitor group 97 corresponding to one scan line Y, but it generally has a plurality of rows of TFT groups 96 and pixel capacitor groups 97 corresponding to a plurality of scan lines.

The liquid crystal gray scale voltage generating circuit 94 generates reference voltages, any of which is selected by a decoder (not shown) including a ROM switch and the like in the D/A converter 93. The D/A converter circuit 93 selects reference voltages based on the 8-bit digital display signals from the latch circuit 92 so as to perform D/A conversion, and then supplies it to the plurality of operational amplifier circuits 100 through the input nodes 11 and 21 as the input signals INP and INN, respectively. The operational amplifier circuit 100 outputs the output signals OUTP and OUTN to the liquid crystal element serving as the pixel capacitor 70 through the output nodes 31 and 32 and the TFT 60. At this time, a gate of the TFT group 70 is driven by an unshown gate driver.

In recent years, even the LCD driver having the number of outputs exceeding 1000 channels has developed, and therefore operational amplifiers each having the voltage follower configuration are required for the number of channels. Accordingly, 1000 times of a power consumption amount of one operational amplifier is the power consumption amount in one chip. For this reason, by using the operational amplifier circuits 100 of the present invention for the LCD driver 901 as described above, the power consumption amount of the one whole chip can be dramatically reduced. Also, as the power consumption amount increases, a chip temperature may reach about 150° C., which is a limit temperature of a silicon device. However, a chip mounted with the operational amplifier circuits 100 according to the present invention can suppress increase of the chip temperature because the power consumption amount is reduced.

The present invention produces an effect in not only for a circuit example of the operational amplifier illustrated in FIGS. 5 and 6 but also the operation amplifier of a Rail-to-Rail type. By configuring the operational amplifier of the Rail-to-Rail type, an effect of improving a symmetrical property of rising/falling characteristics and output deviation required for the characteristics of the LCD driver can be expected.

2. Second Embodiment

Figure 10:
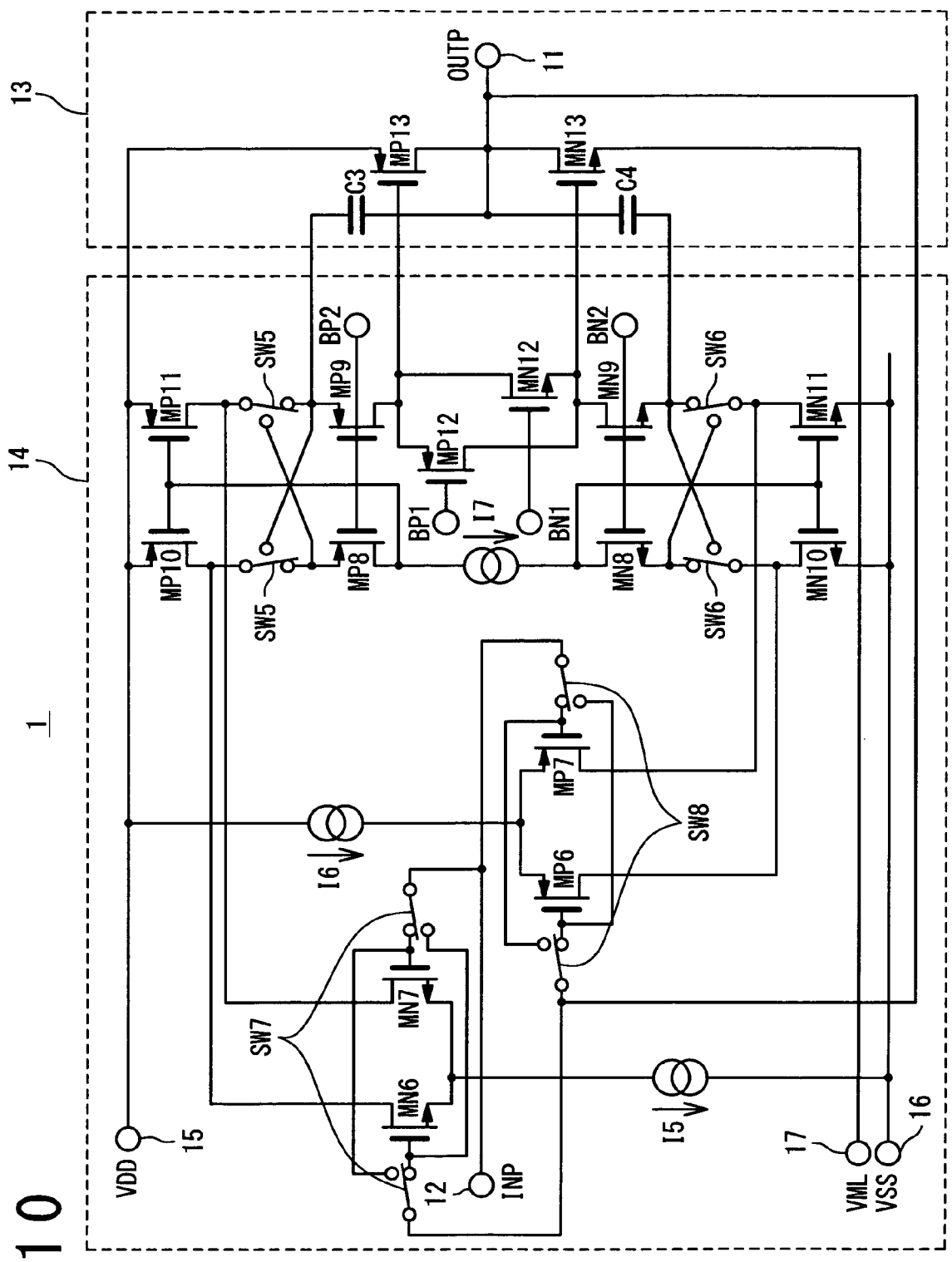
FIG. 10 is a circuit diagram showing a configuration of on a positive polarity amplifier of the operational amplifier circuit according to the second embodiment the present invention.
Figure 11:
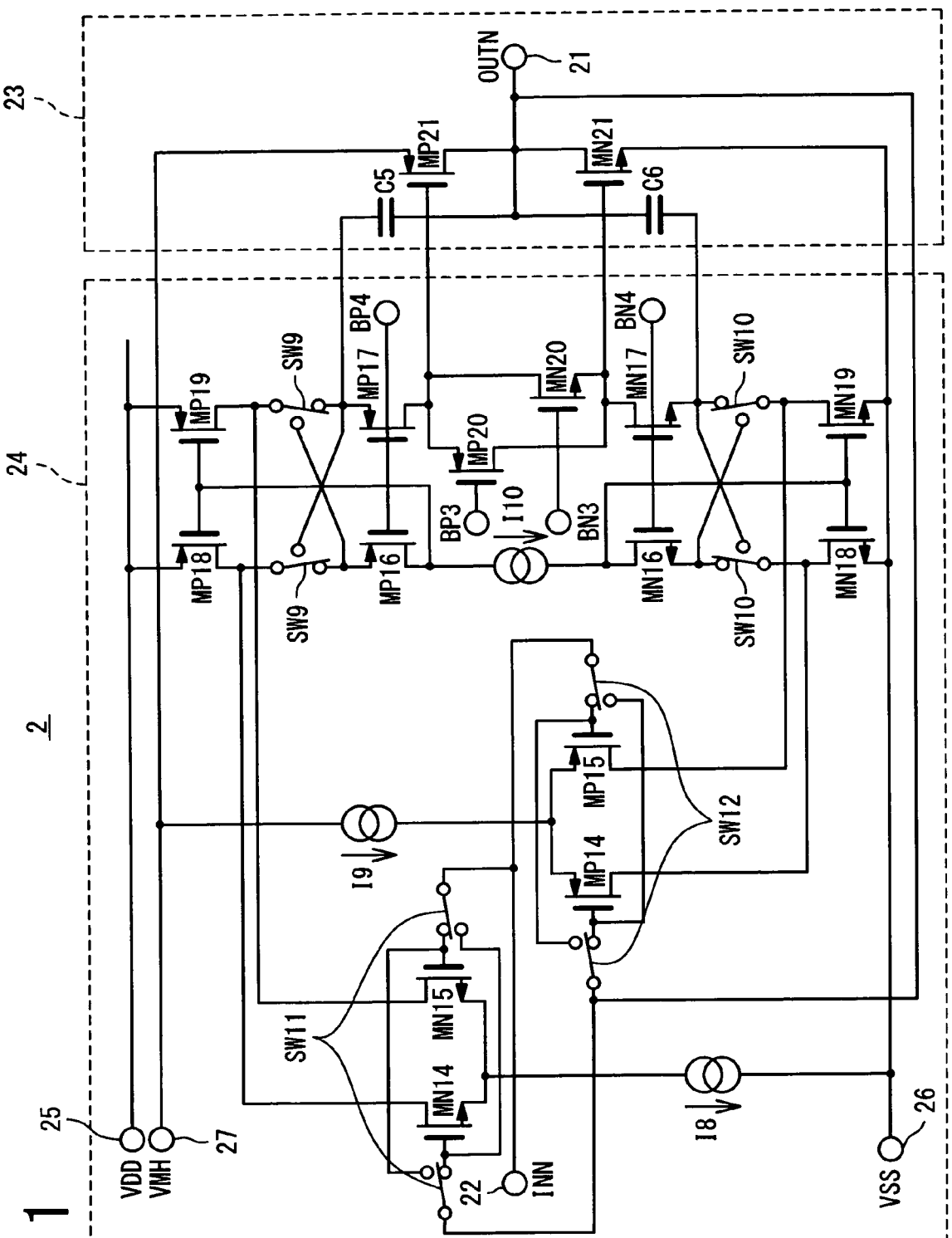
FIG. 11 is a circuit diagram showing a configuration of on a negative polarity amplifier of the operational amplifier circuit according to the second embodiment the present invention.

Referring to FIGS. 10 and 11, an operational amplifier circuit 100 according to a second embodiment of the present invention will be described. In the second embodiment, the operational amplifier circuit 100 performing a Rail-to-Rail operation will be described. The operational amplifier circuit 100 in the second embodiment is preferably mounted and used in the LCD driver, similarly to the first embodiment.

FIG. 10 is a circuit diagram illustrating a configuration of the positive polarity dedicated amplifier 1 in the second embodiment. The positive polarity dedicated amplifier 1 includes, similarly to the first embodiment, an output stage 13 and a differential stage 14. The differential stage 14 in the second embodiment includes NMOS transistors MN6, MN7, MN8, MN9, MN10, MN11, and MN12, PMOS transistors MP6, MP7, MP8, MP9, MP10, MP11, and MP12, constant current sources I5, I6 and I7, and switches SW5, SW6, SW7, and SW8.

The NMOS transistors MN6 and MN7 function as N-channel input differential pair transistors with the differential input pair connected to the non-inversion input node 12 and the inversion input node. Specifically, a gate of the NMOS transistor MN7 is connected to the input node 12 through the switch SW7 and a gate of the NMOS transistor MN6 is connected to the output node 11 through the switch SW7. Also, sources of the NMOS transistors MN6 and MN7 are connected in common to a power supply node 16 (negative polarity power supply voltage VSS) through the constant current source I5.

The PMOS transistors MP6 and MP7 function as P-channel input differential pair transistors with the differential input pair connected to the non-inversion input node 12 and the inversion input node. Specifically, a gate of the PMOS transistor MP7 is connected to the input node 12 through the switch SW8 and a gate of the PMOS transistor MP6 is connected to the output node 11 through the switch SW8. Also, sources of the PMOS transistors MP6 and MP7 are connected in common to a power supply node 15 (positive polarity power supply voltage VDD) through the constant current source I6.

Sources of the PMOS transistors MP10 and MP11 are connected in common to the power supply node 15, and drains of PMOS transistors MP10 and MP11 are connected to respective drains of the N-channel input differential pair transistors MN6 and MN7. Thus, the PMOS transistors MP10 and MP11 function as active load of a folded cascode connection.

Sources of the NMOS transistors MN10 and MN11 are connected in common to the power supply node 16, and drains of them MN10 and MN11 are connected to respective drains of the N-channel input differential pair transistors MP6 and MP7. Thus, the NMOS transistors MN10 and MN11 function as active load of a folded cascode connection.

Gates of the PMOS transistors MP8 and MP9 are connected in common to each other, and supplied with a bias voltage BP2. Also, gates of the NMOS transistors MN8 and MN9 are connected in common to each other, and supplied with a bias voltage BN2.

The switches SW5 are connected between drains of the PMOS transistors MP10 and MP11 and sources of the PMOS transistors MP8 and MP9, respectively. A pattern 1 in which the PMOS transistors MP10 and MP8 are connected to each other and the PMOS transistors MP11 and MP9 are connected to each other and a pattern 2 in which the PMOS transistors MP10 and MP9 are connected to each other and the PMOS transistors MP11 and MP8 are connected to each other are switched by the switches SW5.

The switches SW6 are connected between drains of the NMOS transistors MN10 and MN11 and sources of the NMOS transistors MN8 and MN9. The pattern 1 in which the NMOS transistors MN10 and MN8 are connected to each other and the NMOS transistors MN11 and MN9 are connected to each other and the pattern 2 in which the NMOS transistors MN10 and MN9 are connected to each other and the NMOS transistors MN11 and MN8 are connected to each other are switched by the switches SW6.

The switches SW7 are connected to the input node 12 and the output node 11 at common nodes thereof and a break node of one of the switches SW7 and a make node of the other switch SW7 are connected to one of the gates of the N-channel input differential pair transistors MN6 and MN7, and vice versa. The switches SW7 switch the pattern 1 in which the gate of the NMOS transistor MN6 is connected to the output node 11 and the gate of the NMOS transistor MN7 is connected to the input node 12, and the pattern 2 in which the gate of the NMOS transistor MN6 is connected to the input node 12 and the gate of the NMOS transistor MN7 is connected to the input node 11.

The switches SW8 are connected to the input node 12 and the output node 11 at common nodes thereof, and a break node of one of the switches SW8 and a make node of the other switch SW8 are connected to one of the gates of the P-channel input differential pair transistors MP6 and MP7, and vice versa. The switches SW8 switch the pattern 1 in which the gate of the PMOS transistor MP6 is connected to the output node 11 and the gate of the PMOS transistor MP7 is connected to the input node 12, and the pattern 2 in which the gate of the PMOS transistor MP6 is connected to the input node 12 and the gate of the PMOS transistor MP7 is connected to the output node 11.

The constant current source I5 is connected between the commonly connected sources of the N-channel input differential pair transistors MN6 and MN7 and the power supply node 16. The constant current source I6 is connected between the commonly connected sources of the P-channel input differential pair transistors MP6 and MP7 and the power supply node 15.

One of ends of the constant current source I7 is connected in common to the drain of the PMOS transistor MP8 and gates of the PMOS transistors MP10 and MP11, and the other node is connected in common to the drain of the NMOS transistor MN8 and gates of the NMOS transistors MN10 and MN11. Thus, the constant current source I7 functions as a floating current source.

A drain of the NMOS transistor MN12 is connected to the drain of the PMOS transistor MP9 and the gate of a PMOS transistor MP13, and a source of the NMOS transistor MN12 is connected to the drain of the NMOS transistor MN9 and the gate of an NMOS transistor MN13. A gate of the NMOS transistor MN12 is supplied with a bias voltage BN1. Thus, the NMOS transistor MN12 determines an idling current of the NMOS transistor MN13.

A drain of the PMOS transistor MP12 is connected to the drain of the NMOS transistor MN9 and the gate of the NMOS transistor MN13, and a source of the PMOS transistor MP12 is connected to the drain of the PMOS transistor MP9 and the gate of the PMOS transistor MP13. Also, a gate of the PMOS transistor MP12 is supplied with a bias voltage BP1. Thus, the PMOS transistor MP12 determines an idling current of the PMOS transistor MP13 in the output stage 13.

The output stage 13 in the second embodiment includes the PMOS transistor MP13, the NMOS transistor MN13, and capacitors C3 and C4.

The gate of the PMOS transistor MP13 is connected to the drain of the PMOS transistor MP9, a source of PMOS transistor MP13 is connected to the power supply node 15 (the positive polarity power supply voltage VDD), and a drain of PMOS transistor MP13 is connected to the output node 11. The gate of the NMOS transistor MN13 is connected to the drain of the NMOS transistor MN9, a source of NMOS transistor MN13 is connected to a power supply node 17 (power supply voltage VML), and a drain of NMOS transistor MN13 is connected to the output node 11.

One of ends of the capacitor C3 is connected to the source of the PMOS transistor MP9, and the other end is connected to the output node 11. Thus, the capacitor C3 functions as a phase compensation capacitor. Similarly, one of ends of the capacitor C4 is connected to the source of the NMOS transistor MN9, and the other end is connected to the output node 11. Thus, the capacitor C4 functions as a phase compensation capacitor.

Referring to FIG. 10, an operation of the positive polarity dedicated amplifier 1 in the second embodiment will be described. The Rail-to-Rail operation of the differential stage 14 will be described. In a power supply voltage range in which the differential pair including the PMOS transistors MP6 and MP7 does not operate, the differential pair including the NMOS transistors MN6 and MN7 operates, whereas in a power supply voltage range in which the differential pair including the NMOS transistors MN6 and MN7 does not operate, the differential pair including the PMOS transistors MP6 and MP7 operates. As a result, a differential stage that operates in the whole power supply voltage range can be obtained. That is, in the differential stage 14, characteristics of the Rail-to-Rail are achieved. However, regarding an output voltage range, the Rail-to-Rail characteristics are not achieved. This is described below.

If the power supply voltage VML is approximately a half of the positive polarity power supply voltage VDD, i.e., VDD/2, the output voltage range of the output stage 13 is from (VDD/2+0.2 V) to (VDD−0.2 V). This voltage range sufficiently meets the output characteristics required for the positive polarity dedicated amplifier used for the LCD driver.

There is a difference of approximately VDD/2 between a source-drain voltage of the PMOS transistor MP9 and a source-drain voltage of the NMOS transistor MN9. However, the PMOS transistor MP9 and the NMOS transistor MN9 operate with the respective gates thereof being grounded, and therefore output impedances are very high. Accordingly, respective drain current errors due to the above-described voltage difference are very small, and an influence of the power supply voltage VML on the input characteristics is very small.

Also, if the positive polarity dedicated amplifier 1 in the second embodiment is applied to a positive polarity dedicated output amplifier of the LCD driver, an offset cancel circuit (switches SW5 to SW8) is required for a system configuration in order to meet a specification of amplitude difference deviation. Referring to FIG. 10, an offset cancel operation in the positive polarity dedicated amplifier 1 will be described. It should be noted that it is assumed that all of the switches SW5 to SW8 operate in conjunction with each other. That is, the number of states switchable by the switches SW5 to SW8 is only two, i.e., the above-described patterns 1 and 2.

The switches SW5 can switch an offset voltage caused due to a variation in threshold voltage (VT) of the active load including the PMOS transistors MP10 and MP11. Similarly, the switches SW6 can switch an offset voltage caused due to a variation in the threshold voltage (VT) of the active load including the NMOS transistors MN10 and MN11.

Also, the switches SW7 can switch an offset voltage caused due to a variation in the threshold voltage (VT) of the input differential pair N-channel transistors including the NMOS transistors MN6 and MN7. Similarly, the switches SW8 can switch an offset voltage caused due to a variation in threshold voltage (VT) of the input differential pair P-channel transistors including the PMOS transistors MP6 and MP7.

The offset voltage of the positive polarity dedicated amplifier 1 in the second embodiment is mostly determined based on four variation factors, i.e., (1) the variation in threshold voltage (VT) of the active load including the PMOS transistors MP10 and MP11, (2) the variation in threshold voltage (VT) of the active load including the NMOS transistors MN10 and MN11, (3) the variation in threshold voltage (VT) of the N-channel input differential pair transistors including the NMOS transistors MN6 and MN7, and (4) the variation in threshold voltage (VT) of the P-channel input differential pair transistors including the PMOS transistors MP6 and MP7. Accordingly, the offset voltage caused due to the four factors is supplied to have a reverse polarity with respect to an ideal voltage by switching the switches SW5 to SW8 as described above. That is, given that the offset voltage caused due to the four factors is denoted by Vos, a voltage of the input signal INP by Vin, and a voltage of the output signal OUTP by Vout, the output voltage Vout becomes Vout=Vout±Vos, every time the switches are switched. Here, a polarity indicated by "±" represents "+" in one of the switching states, and "−" in the other switching state, depending on two states of the switches. The polarity depends on an original offset voltage of the amplifier.

Next, the constant current source I7 functioning as a floating constant current source will be described. Setting values of the floating constant current source are obtained as follows. First, because a summation of gate-source voltages of the PMOS transistors MP12 and MP13 equals to a bias voltage BP1 or BN1 ($V_{BP1}$), the following equation (1) is established:

$$V_{(BP1)} = V_{GS(MP12)} + V_{GS(MP13)} \tag{1}$$

Here, the gate-source voltage of the PMOS transistor MP12 is denoted by $V_{GS(HP12)}$ and the gate-source voltage of the PMOS transistor MP13 by $V_{GS(HP15)}$.

Also, a gate-source voltage is generally represented by the following equation (2):

$$V_{GS} = \sqrt{\frac{2I_P}{\beta}} + V_T \tag{2}$$

Here, a gate width is denoted by W, a gate length by L, mobility by μ, a gate oxide film capacitance per unit by Co, threshold voltage by $V_T$, a drain current by $I_D$, and $\beta=(W/L)\mu Co$.

When the differential pair transistors MN6 and MN7 perform an amplifying operation, drain currents of both the transistors are equal to each other. Accordingly, each of the drain currents of the NMOS transistors MN6 and MN7 is a half (I7/2) of a current from the constant current source I7. Also, in general, the bias voltage $V_{BP1}$ is preferably set such that drain current of the PMOS transistors MP12 and the drain current of the NMOS transistor MN12 for the floating current source are equal to each other. Here, given that the idling current of the PMOS transistor MP13 in the output stage 13 is denoted by $I_{idle(HP13)}$, the idling current $I_{idle(HP13)}$ meets the following equation (3):

$$V_{(BP1)} = \sqrt{\frac{I_7}{\beta_{(MP12)}}} + \sqrt{\frac{2I_{idle(MP13)}}{\beta_{(MP13)}}} + 2V_T \quad (3)$$

Here, β of the PMOS transistor MP12 is denoted by $\beta_{(HP12)}$, and β of the PMOS transistor MP13 is denoted by $\beta_{(HP13)}$. Details of a power supply circuit for generating the bias voltage $V_{BP1}$ are not described here. However, the equation (3) can be solved with respect to $I_{idle(MP13)}$.

The bias voltage BN1 is preferably set in the same manner such that the drain currents of the NMOS transistor MN12 and the NMOS transistors MN13 for the floating current source are equal to each other. In the above manner, the floating constant current source is set.

It should be noted that a constant voltage source $V_{BN1}$ for supplying the bias voltage $V_{BN1}$ and a constant voltage source $V_{BP1}$ for supplying the bias voltage $V_{BP1}$ have resistance to deviation due to variation of elements by forming from the two MOS transistors and the constant current source. The reason is in that the term $V_{BP1}$ on a left hand side of Expression (3) has the term "$2V_T$" in the same way as the right hand side, and therefore the terms can be removed on the left hand and right hand sides.

FIG. 11 is a circuit diagram illustrating a configuration of a negative polarity dedicated amplifier 2 in the second embodiment. The negative polarity dedicated amplifier 2 includes an output stage 23 and a differential stage 24, similarly to the positive polarity dedicated amplifier 1. The differential stage 24 in the second embodiment includes NMOS transistors MN14, MN15, MN16, MN17, MN18, MN19, and MN20, PMOS transistors MP14, MP15, MP16, MP17, MP18, MP19, and MP20, constant current source I8, I9, and I10, and switches SW9, SW10, SW11, and SW12.

The NMOS transistors MN14 and MN15 function as N-channel input differential pair transistors with the differential input pair connected to a non-inversion input node 22 and inversion input node. Specifically, a gate of the NMOS transistor MN15 is connected to the input node 22 through the switch SW11 and a gate of the NMOS transistor MN14 is connected to the output node 21 through the switch SW11. Also, sources of the NMOS transistors MN14 and MN15 are connected in common to a power supply node 26 (negative polarity power supply voltage VSS) through the constant current source I8.

The PMOS transistors MP14 and MP15 function as P-channel input differential pair transistors with the differential input pair connected to the non-inversion input node 22 and inversion input node. Specifically, a gate of the PMOS transistor MP15 is connected to the input node 22 through the switch SW12 and a gate of the PMOS transistor MP14 is connected to the output node 21 through the switch SW12. Also, sources of the PMOS transistors MP14 and MP15 are connected in common to a power supply node 25 (positive polarity power supply voltage VDD) through the constant current source I9.

Sources of the PMOS transistors MP18 and MP19 are connected in common to the power supply node 15, and drains of PMOS transistors MP18 and MP19 are connected to respective drains of the N-channel input differential pair transistors MN14 and MN15. Thus, the PMOS transistors MP18 and MP19 function as active load of a folded cascode connection.

Sources of the NMOS transistors MN18 and MN19 are connected in common to the power supply node 26 (negative polarity power supply voltage VSS), and drains of the NMOS transistors MN18 and MN19 are connected to respective drains of the N-channel input differential pair transistors MP14 and MP15. Thus, the NMOS transistors MN18 and MN19 function as active load of a folded cascode connection.

Gates of the PMOS transistors MP16 and MP17 are connected in common to each other, and supplied with a bias voltage BP4. Also, gates of the NMOS transistors MN16 and MN17 are connected in common to each other, and supplied with a bias voltage BN4.

The switches SW9 are connected between drains of the PMOS transistors MP18 and MP19 and sources of the PMOS transistors MP16 and MP17. The switches SW9 switch the pattern 1 in which the PMOS transistors MP18 and MP16 are connected to each other and PMOS transistors MP19 and MP17 are connected to each other and the pattern 2 in which the PMOS transistors MP18 and MP17 are connected to each other and PMOS transistors MP19 and MP16 are connected to each other.

The switches SW10 are connected between the drains of the NMOS transistors MN18 and MN19 and sources of the NMOS transistors MN16 and MN17. The switches SW10 switch the pattern 1 in which the NMOS transistors MN18 and MN16 are connected to each other and NMOS transistors MN19 and MN17 are connected to each other and the pattern 2 in which the NMOS transistors MN18 and MN17 are connected to each other and the NMOS transistors MN19 and MN16 are connected to each other.

The switches SW11 are connected to the input node 22 and the output node 21 at common nodes thereof; and a break node of one of the switches SW11 and a make node of the other one SW11 are connected to one of the gates of the N-channel input differential pair transistors MN14 and MN15, and vice versa. The switches SW11 switch the pattern 1 in which the gate of the NMOS transistor MN14 is connected to the output node 21 and the gate of the NMOS transistor MN15 is connected to the input node 21, and the pattern 2 in which the gate of the NMOS transistor MN14 is connected to the input node 22 and the gate of the NMOS transistor MN15 is connected to the output node 21.

The switches SW12 are connected to the input node 22 and the output node 21 at common nodes thereof; and a break node of one of the switches SW12 and a make node of the other switch SW12 are connected to one of the gates of the P-channel input differential pair transistors PN14 and MP15, and vice versa. The switches SW12 switch the pattern 1 in which the gate of the PMOS transistor MP14 is connected the output node 21 and the gate of the PMOS transistor MP15 is connected to the input node 21, and the pattern 2 in which the gate of the of the PMOS transistor MP14 is connected to the input node 22 and the gate of the of the PMOS transistor MP15 is connected to the output node 21.

The constant current source I8 is connected between the commonly connected sources of the N-channel input differential pair transistors MN14 and MN15 and the power supply node 26 of the negative polarity power supply voltage VSS. The constant current source I9 is connected between the commonly connected sources of the P-channel input differential pair transistors MP14 and MP15 and the power supply node 25 of the positive polarity power supply voltage VDD.

One of ends of the constant current source I10 is connected in common to the drain of the PMOS transistor MP16 and gates of the PMOS transistors MP18 and MP19, and the other end is connected in common to the drain of the NMOS transistor MN16 and gates of the NMOS transistors MN18 and MN19. Thus, the constant current source I10 functions as a floating current source.

A drain of the NMOS transistor MN20 is connected to a drain of the PMOS transistor MP17 and a gate of a PMOS transistor MP21, and a source of the NMOS transistor MN20 is connected to the drain of the NMOS transistor MN17, and a gate of a NMOS transistor MN21. Also, a gate of the NMOS transistor MN20 is supplied with a bias voltage BN3. Thus, the NMOS transistor MN20 determines an idling current of the NMOS transistor MN21.

A drain of the PMOS transistor MP20 is connected to the drain of the NMOS transistor MN17 and a gate of the NMOS transistor MN21, and a source of the PMOS transistor MP20 is connected to the drain of the PMOS transistor MP17, and the gate of the PMOS transistor MP21. Also, a gate of the PMOS transistor MP20 is supplied with the bias voltage BP3. Thus, the PMOS transistor MP20 determines an idling current of the PMOS transistor MP21 in the output stage 13.

The output stage 13 in the second embodiment includes the PMOS transistor MP21, the NMOS transistor MN21, and capacitors C5 and C6.

The gate of the PMOS transistor MP21 is connected to the drain of the PMOS transistor MP17, a source thereof is connected to the power supply node 27 (positive polarity power supply voltage VMH), and a drain of the PMOS transistor MP21 is connected to the output node 21. The gate of the NMOS transistor MN21 is connected to the drain of the NMOS transistor MN17, a source of the NMOS transistor MN21 is connected to a power supply node 27 (power supply voltage VSS), and a drain of the NMOS transistor MN21 is connected to the output node 21.

One of ebds of the capacitor C5 is connected to the source of the PMOS transistor MP17, and the other end is connected to the output node 21. Thus, the capacitor C5 functions as a phase compensation capacitor. Similarly, one of ends of the capacitor C6 is connected to the source of the NMOS transistor MN17, and the other end thereof is connected to the output node 21. Thus, the capacitor C6 functions as a phase compensation capacitor.

Referring to FIG. 11, an operation of the negative polarity dedicated amplifier 2 in the second embodiment will be described. The Rail-to-Rail operation in the differential stage 24 will be described. In a power supply voltage range in which the differential pair including the PMOS transistors MP14 and MP15 does not operate, the differential pair including the NMOS transistors MN14 and MN15 operates, whereas in a power supply voltage range in which the differential pair including the NMOS transistors MN14 and MN15 does not operate, the differential pair including the PMOS transistors MP14 and MP15 operates. As a result, the differential stage can be obtained that operates in the whole power supply voltage input range. That is, in the differential stage 24, the Rail-to-Rail characteristics are achieved. However, regarding an output voltage range, the Rail-to-Rail characteristics are not achieved. This will be described below.

If the power supply voltage VMH is approximately a half (VDD/2) of the positive polarity power supply voltage VDD, an output voltage range of the output stage 23 is in a range from (VSS+0.2 V) to (VDD/2−0.2 V). This voltage range sufficiently meets the output characteristics required for the negative polarity dedicated amplifier used for the LCD driver.

There is a difference of approximately VDD/2 between a source-drain voltage of the PMOS transistor MP17 and a source-drain voltage of the NMOS transistor MN17. However, the PMOS transistor MP17 and the NMOS transistor MN17 operate with the respective gates thereof being grounded, and therefore output impedances are very high. Accordingly, respective drain current errors due to the above-described voltage difference are very small, and an influence of the power supply voltage VMH on the input characteristics is very small.

Also, when the negative polarity dedicated amplifier 2 in the second embodiment is applied to a positive polarity dedicated output amplifier of the LCD driver, an offset cancel circuit is required for a system configuration in order to meet the specification of the amplitude difference deviation. Referring to FIG. 11, the offset cancel will be described. It should be noted that it is assumed that all of the switches SW9 to SW12 operate in conjunction with each other. That is, the number of states switchable by the switches SW9 to SW12 is only two, i.e., the above-described patterns 1 and 2.

The switches SW9 can switch an offset voltage caused due to variation in threshold voltages (VT) of the active load including the PMOS transistors MP18 and MP19. Similarly, the switches SW10 can switch an offset voltage caused by variation in threshold voltages (VT) of the active load including the NMOS transistors MN18 and MN19.

Also, the switches SW11 can switch an offset voltage caused due to variation in threshold voltages (VT) of the N-channel input differential pair transistors including the NMOS transistors MN14 and MN15. Similarly, the switches SW12 can switch an offset voltage caused due to variation in threshold voltage (VT) of the P-channel input differential pair transistors including the PMOS transistors MP14 and MP15.

An offset voltage of the negative polarity dedicated amplifier 2 in the second embodiment is mostly determined by four variation factors, i.e., (1) the variation in the threshold voltages (VT) of the active load including the PMOS transistors MP18 and MP19, (2) the variation in the threshold voltages (VT) of the active load including the NMOS transistors MN18 and MN19, (3) the variation in the threshold voltages (VT) of the N-channel input differential pair transistors including the NMOS transistors MN14 and MN15, and (4) the variation in the threshold voltages (VT) of the P-channel input differential pair transistors including the PMOS transistors MP14 and MP15. Accordingly, the offset voltage caused due to the four factors is supplied to have a reverse polarity with respect to an ideal voltage by switching the switches SW9 to SW12 as described above. That is, given that the offset voltage caused due to the four factors is denoted by Vos, the voltage of the input signal INN by Vin, and an output voltage of the output signal OUTN by Vout, the output voltage Vout is Vout=Vout±Vos every time the switches are switched. Here, the polarities indicated by "±" mean "+" in one of the switching states, or "−" in the other switching state, depending on the two states of the switches. The polarities depend on an original offset voltage of an amplifier.

As described above, in the operational amplifier circuit 100 according to the second embodiment, similarly to the first embodiment, the power consumption amount is reduced by changing the output voltage range, and also a symmetrical property of the rising/falling characteristics and the output deviation required as the characteristics of the LCD driver are improved on the basis of the Rail-to-Rail operation. Also, the power supply voltages VML and VMH are preferably set to values similar to those in the first embodiment. In addition, an offset cancelling operation in the negative polarity dedicated amplifier 2 is the same as that of the positive polarity dedicated amplifier 1, and therefore detailed description thereof is omitted.

As described above, according to the present invention, in a system in which a positive polarity amplifier and a negative polarity amplifier are respectively designed exclusively, each of the amplifiers is divided into two stages, i.e., the differential stage and the output stage. In the positive polarity dedicated amplifier, the differential stage 14 of the positive polarity amplifier operates in the maximum voltage range between the positive polarity power supply voltage VDD and the negative polarity power supply voltage VSS; and the output stage 13 operates between the power supply voltage VML that is higher than the negative polarity power supply voltage VSS and the positive polarity power supply voltage VDD. In the negative polarity dedicated amplifier, similarly to the positive polarity dedicated amplifier, the differential stage 24 operates in the maximum voltage range between the positive polarity power supply voltage VDD and the negative polarity power supply voltage VS, and the output stage 23 operates between the power supply voltage VMH that is lower than the positive polarity power supply voltage VDD and the negative polarity power supply voltage VSS. Thus, the power consumption amounts of the operational amplifiers 1 and 2, in particular, the power consumption amounts of the output stages 13 and 23 can be reduced.

Also, the power supply voltage ranges to the output stages 13 and 23, and the power supply voltage ranges to the differential stages 13 and 24 can be respectively arbitrarily changed, and therefore the input and output characteristics of the operational amplifiers 1 and 2 can be respectively arbitrarily changed. For this reason, by changing the power supply voltage ranges of the output stages 13 and 23 while meeting the required input characteristics, the power consumption amounts of the output stages 13 and 23 can be reduced.

Figure 8:
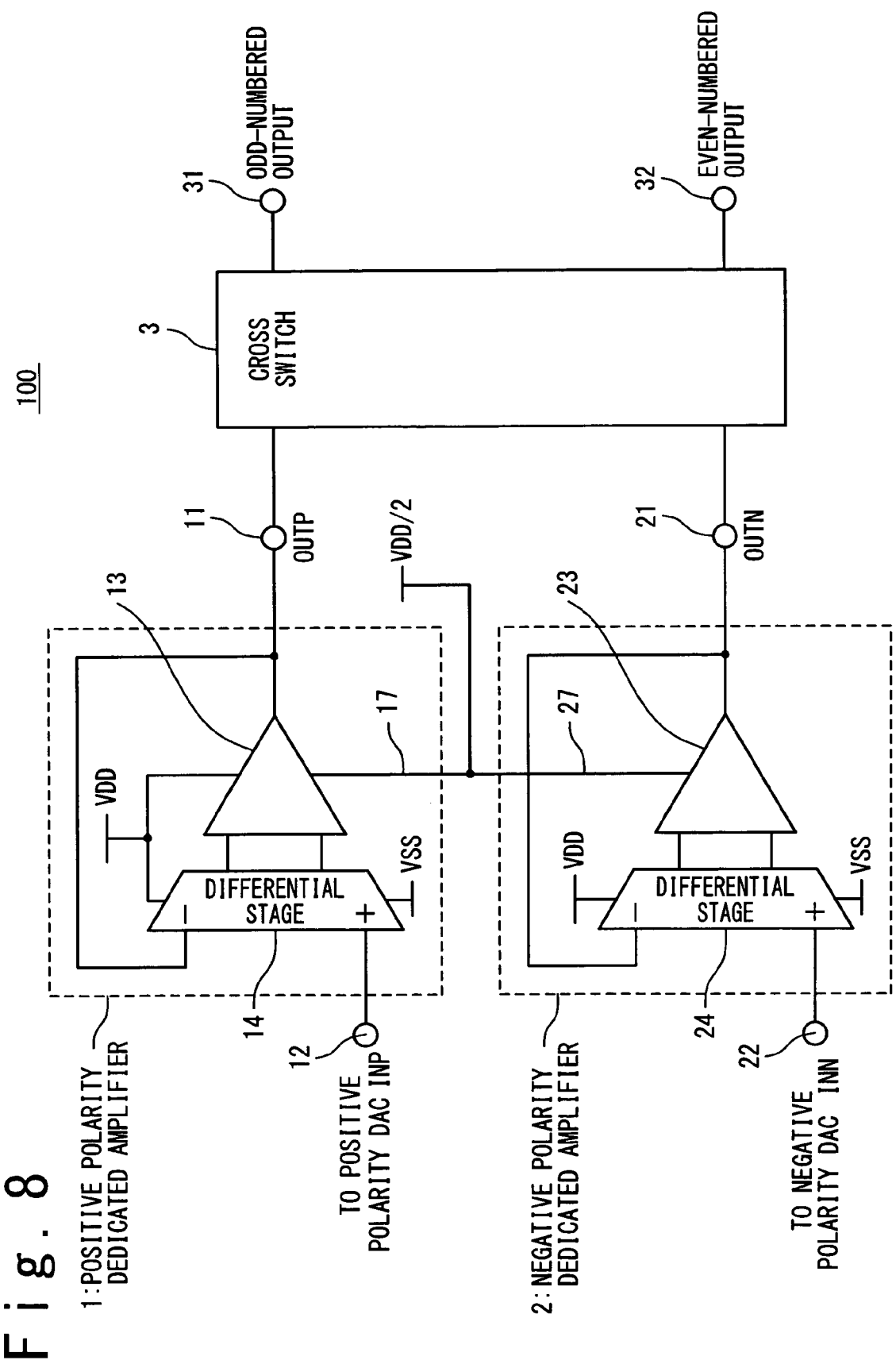
FIG. 8 is a circuit diagram showing the configuration of the operational amplifier circuit according to a second embodiment of the present invention.

The embodiments of the present invention have been described above. However, the configurations of the present invention are not limited to any of the above-described embodiments, but any modification without departing from the scope of the present invention may be included in the present invention. For example, the power supply voltages VML and VMH may be a same voltage. In this case, as illustrated in FIG. 8, the power supply nodes 17 and 27 are connected in common, and as the power supply voltage VML (VMH), a half (VDD/2) of the positive polarity power supply voltage VDD is supplied. Thus, the number of power supplies connected to the operational amplifiers 1 and 2 can be reduced by one while approximately halving the power consumptions of the output stages 13 and 23.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An operational amplifier circuit comprising:
    an input differential stage circuit supplied with power supply voltages in a first voltage range;
    an output stage circuit supplied with power supply voltages in a second voltage range which is different from said first voltage range;
    a positive polarity amplifier; and
    a negative polarity amplifier,
    wherein said operational amplifier circuit amplifies a signal supplied to said input differential stage circuit and outputs the amplified signal from said output stage circuit to drive a load,
    an input differential stage circuit of said positive polarity amplifier is supplied with first and second voltages as the power supply voltages,
    an output stage circuit of said positive polarity amplifier is supplied the second voltage and a third voltage higher than the first voltage as the power supply voltages,
    an input differential stage circuit of said negative polarity amplifier is supplied with the first voltage and the second voltage as the power supply voltages, and
    an output stage circuit of said negative polarity amplifier is supplied with the first voltage and a fourth voltage lower than the second voltage as the power supply voltage.

2. The operational amplifier circuit according to claim 1, wherein said second voltage range is narrower than said first voltage range.

3. The operational amplifier circuit according to claim 1, wherein the third voltage and the fourth voltage are equal to each other.

4. The operational amplifier circuit according to claim 3, wherein the third voltage and the fourth voltage comprise a middle voltage between the first voltage and the second voltage.

5. The operational amplifier circuit according to claim 1, wherein said input differential stage circuit operates to meet Rail-to-Rail.

6. The operational amplifier circuit according to claim 5, wherein said input differential stage circuit is provided with a gate grounded circuit in which a drain is connected with said output stage circuit.

7. The operational amplifier circuit according to claim 5, wherein said input differential stage circuit further comprises:
    an offset cancelling circuit configured to switch a polarity of an offset voltage supplied to the output voltage from said output stage circuit.

8. A display apparatus comprising:
    a digital-analog converter configured to output one of reference voltages outputted from a gray scale voltage generating circuit to an operational amplifier circuit based on a display signal;
    a display panel having a pixel; and
        said operational amplifier circuit configured to drive said pixel based on the output from said digital-analog converter,
    wherein said operational amplifier circuit comprises:
        an input differential stage circuit supplied with power supply voltages in a first voltage range and configured to amplify a signal outputted from said digital-analog converter;
        an output stage circuit supplied with power supply voltages in a second voltage range which is different from said first voltage range, and configured to output the amplified signal to drive the pixel as a load;
        a positive polarity amplifier; and
        a negative polarity amplifier, and
    wherein an input differential stage circuit of said positive polarity amplifier is supplied with first and second voltages as the power supply voltages, an output stage circuit of said positive polarity amplifier is supplied the second voltage and a third voltage higher than the first voltage as the power supply voltages, an input differential stage circuit of said negative polarity amplifier is supplied with the first voltage and the second voltage as the power supply voltages; and an output stage circuit of said negative polarity amplifier is supplied with the first voltage and a fourth voltage lower than the second voltage as the power supply voltage.

9. The display apparatus according to claim 8, wherein said second voltage range is narrower than said first voltage range.

10. The display apparatus according to claim 8, wherein the third voltage and the fourth voltage are equal to each other.

11. The display apparatus according to claim 10, wherein the third voltage and the fourth voltage comprise a middle voltage between the first voltage and the second voltage.

12. The display apparatus according to claim 8 wherein said input differential stage circuit operates to meet Rail-to-Rail.

13. The display apparatus according to claim 12, wherein said input differential stage circuit is provided with a gate grounded circuit in which a drain is connected with said output stage circuit.

14. The display apparatus according to claim 12, wherein said input differential stage circuit further comprises:

an offset cancelling circuit configured to switch a polarity of an offset voltage supplied to the output voltage from said output stage circuit.

* * * * *